United States Patent [19]
Lei

[11] Patent Number: 5,418,532
[45] Date of Patent: May 23, 1995

[54] METHOD AND SYSTEM FOR EFFICIENT, MULTIPLICATION-FREE ARITHMETIC CODING

[75] Inventor: Shaw-Min Lei, Tinton Falls, N.J.

[73] Assignee: Bell Communications Research, Inc., Livingston, N.J.

[21] Appl. No.: 61,150

[22] Filed: May 13, 1993

[51] Int. Cl.$^6$ .............................................. H03M 7/30
[52] U.S. Cl. ................................................... 341/107
[58] Field of Search ............................ 341/51, 107, 60

[56] References Cited

U.S. PATENT DOCUMENTS 4,652,856 3/1987 Mohiuddin et al. .................. 341/60
4,989,000 1/1991 Chevion et al. ..................... 341/107

*Primary Examiner*—Howard L. Williams
*Attorney, Agent, or Firm*—Leonard Charles Suchyta; Joseph Giordano

[57] ABSTRACT

Method and system are provided for efficient, multiplication-free arithmetic coding wherein data which represents an alphabet of source symbols is compressed and decompressed in a data transmission system. Multiplications are replaced with single shift-and-add operation using a suitable shift register wherein a multiplier has at most two bits. The shift-and-add operation approximates the width of a new subinterval within a predetermined interval. This approximation is a function of both the width of a current subinterval and a total count of source symbols in a statistical source model. In this way, an adaptive model can be accommodated as well as a fixed model for the statistics of the source symbols. In one embodiment, the multiplier is preferably determined by a table look-up having a small number of entries and which can be easily implemented by hardware or software.

9 Claims, 6 Drawing Sheets

METHOD AND SYSTEM FOR EFFICIENT, MULTIPLICATION-FREE ARITHMETIC CODING

TECHNICAL FIELD

This invention relates to data compression methods and systems and, in particular, to such methods and systems which utilize multiplication-free arithmetic coding.

BACKGROUND ART

Arithmetic coding is a relatively new lossless data compression technique that has attracted much attention in recent years. Such coding is useful for video compression, text or data file compression and anything needing lossless data compression. It provides more flexibility and better efficiency than the Huffman coding. Arithmetic coding completely bypasses the traditional coding paradigm: replacing an input symbol with a specific code. Instead, it represents a stream of input symbols by a binary number in the interval [0,1) which evolves as each input symbol is encoded. The longer the message, the more bits are needed to specify this number. This approach totally relaxes the constraint upon Huffman coding: each symbol has to be encoded by an integral number of bits and by at least one bit. Thus, its coding results can be closer to Shannon's entropy bound.

Arithmetic coding originated from the general concept due to Shannon that a code string can be viewed as a binary fraction pointing to the subinterval for a particular symbol sequence. This concept has been applied to successive subdivision of the interval. A LIFO-form (last-in-first-out) of arithmetic codes has been introduced and has been modified to a FIFO-form (first-in-first-out).

Basic Arithmetic Codes

Let the alphabet $\mathcal{A}$ consist of symbols $i \in \{1,2,\ldots,m\} = \mathcal{A}$. The arithmetic coding is initialized by a unit interval [0,1) which is described by its size $A(\emptyset)=1$ and a beginning pointer $C(\emptyset)=0$, where $\emptyset$ denotes a null string. When encoding the symbol i, immediately following the so-far processed string s, the following updates of $A(s)$ and $C(s)$ have to be conducted:

$$A(si) = A(s) \cdot p(i|s), \quad (1)$$

$$C(si) = C(s) + A(s) \cdot \sum_{j=1}^{i-1} p(j|s), \quad (2)$$

where $p(i|s)$ is the conditional probability of symbol i given previous string s. The updates of A and C can be explained by FIG. 1. Basically, the current interval, represented by $A(s)$ and $C(s)$, is viewed to consist of m subintervals, corresponding to m different symbols respectively in $\mathcal{A}$. The size of the subinterval corresponding to symbol j is proportional to its conditional probability $p(j|s)$. The encoding of symbol i is to zoom in the current interval into the subinterval corresponding to i. The beginning pointer of the current interval, $C(s)$, is also called the code since it is the code actually transmitted to the decoder. The quantity added to $C(s)$ in (2) is usually called augend.

In practice, since finite bits (w bits) are used to represent $A(s)$ and $C(s)$ each, two extra operations have to be done: 1) bit truncation after multiplications, and 2) normalization of A and C. The results of multiplications have to be truncated to maintain the same number of bits below the binary point. This truncation introduces very minor performance degradation if A and C registers are long enough.

It can be shown that the unique decodability of the arithmetic code is still maintained after the truncation, but not after rounding. It is possible to use rounding to reduce the final word-length effect of an arithmetic code, but the update of A(si) in (1) has to be modified slightly.

As the encoding of arithmetic codes proceed, $A(s)$ is becoming smaller and smaller as encoding proceeds. In order to keep as many significant bits as possible, normalization of A to a value close to 1 is needed. The normalization is actually only a left shift and the normalized quantity $a(s)$ can be represented by $a(s)=2^{L(s)}A(S)$, where $L(s)$ is chosen such that $a(s)$ is in a desired range [k,2k). The value of k can be 0.5 or 1 for easy normalization. Rissanen and Mohiuddin chose k to be 0.75. The code $C(s)$ is also normalized by the same shift, i.e., normalized quantity $c(s)=2^{L(s)}C(s)$. The bits shifted out of register C are ready to be transmitted if there is not further carry-over. The long carry-over can be blocked by a bit stuffing technique, i.e. zero insertion. A guard register of width $w_g$ may be placed to the left end of C in order to reduce the needed stuffing bits.

The probability model $p(j|s)$ can be updated independently from the encoding procedure and is usually approximated by some statistical counts, i.e., $p(j|s) \approx N_j(s)/N(s)$, where $N_j(s)$ is the individual count for j and $$N(s) = \sum_{j=1}^{m} N_j(s).$$

The total count $N(s)$ can also be normalized into a desired range [k', 2k') by $n(s)=2^{L'(s)}N(s)$, such that $n(s) \in [k', 2k')$. The individual counts $N_j(s)$ should be normalized by the same way, i.e., $n_j(s)=2^{L'(s)}N_j(s)$.

Rissanen-Mohiuddin's Multiplication-Free Code

Rissanen and Mohiuddin proposed a very simple scheme to eliminate the multiplications in (1) and (2). They normalized both $a(s)$ and $n(s)$ to the same range of [0.75, 1.5) and made an approximation $a(s)/n(s) \sim 1$. The updates of $a(s)$ and $c(s)$ are simplified as:

$$a(si) = \begin{cases} [2^{-\beta}n_i(s)]_N, & \text{if } i \neq m, \\ [a(s) - 2^{-\beta}r_m(s)]_N, & \text{if } i = m, \end{cases} \quad (3)$$

$$c(si) = [c(s) + 2^{-\beta}r_i(s)]_N, \quad (4)$$

where $[\cdot]_N$ represents the normalization operation mentioned in the last section, $$r_1(s) = 0 \text{ and } r_i(s) = \sum_{j=1}^{i-1} n_j(s),$$

for $i=2,3,\ldots,m$, and
$\beta=0$, if $a(s) < r_m(s)$, $\beta=1$, otherwise.

Comparing (3) to (1), one can view that this multiplication-free code is using the following modified probability model, instead of the ideal model $\{n_j(s)/n(s)\}$.

$$p(i|s) \approx \begin{cases} \dfrac{2^{-\beta_{n_i(s)}}}{a(s)}, & \text{if } i \neq m, \\ 1 - \dfrac{2^{-\beta_{r_m(s)}}}{a(s)}, & \text{if } i = m \end{cases} \quad (5)$$

For simplicity, the notation(s), denoting the dependency on the previous string s, is omitted in the following analysis without any ambiguity. The ideal average coding length, $l_i$, is known to be:

$$l_i = - \sum_{j=1}^{m} \frac{n_j}{n} \log_2 \frac{n_j}{n} . \quad (6)$$

The actual average coding length, $l_a(s)$, using the probability model of (5), is:

$$l_a = - \sum_{j=1}^{m-1} \frac{n_j}{n} \log_2 \frac{2^{-\beta_{n_i}}}{a} - \quad (7)$$

$$\frac{n_m}{n} \log_2 \left( 1 - \frac{2^{-\beta}(n-n_m)}{a} \right) .$$

The degradation of Rissanen-Mohiuddin's multiplication-free code is:

$$\delta = l_a - l_i = \frac{n_m}{n} \log_2 \frac{n_m}{n} - \quad (8)$$

$$\left( 1 - \frac{n_m}{n} \right) \log_2 \frac{2^{-\beta}}{a/n} - \frac{n_m}{n} \log_2 \left[ 1 - \frac{2^{-\beta}}{a/n} \left( 1 - \frac{n_m}{n} \right) \right].$$

$\delta$ is a function of $n_m/n$ and $a/n$, but not of $\beta$ since $\beta$ is determined by $n_m/n$ and $a/n$. FIG. 2 give plots of $\delta$ versus $a/n$ for different $n_m/n$. The range of $a/n$ is from 0.5 to 2 if a and n have the same normalization range. From FIG. 2, one can observe that $\delta$ becomes smaller as $n_m/n$ increases. This is the reason why Rissanen and Mohiuddin suggested to place the most probable symbol at the last position. For the plots of $n_m/n < 0.5$, there is a discontinuity at $a/n = 1-n_m/n$ where $\beta$ changes from 1 to 0, and $\delta$ goes to infinity when approaching this discontinuity point from the right. Therefore, one can expect that the performance of this multiplication-free code will degrade significantly when $n_m/n$ is small.

The performance analysis of Rissanen-Mohiuddin did not obtain (8) and did not provide the view given by FIG. 2. Instead, their analysis used a fixed probability model and normalized n=1. They then made an assumption that a was a stochastic process and was uniformly distributed over [0.75, 1.5). Based on this assumption, they derived the average degradation over a. The result they obtained is equal to the integral of (8) on a (from 0.75 to 1.5) divided by 0.75, although they used a different approach. They also derived the optimum scaling range, $[k_{opt}, 2k_{opt})$, assuming a was uniformly distributed over this scaling range. The $k_{opt}$ for different values of $n_m$ were obtained by numerical minimization. The $k_{opt}$ they obtained was based on the assumption of uniform distribution over $[k_{opt}, 2k_{opt})$. For $p_m(=n_m/n)=0.1$, $k_{opt}$ they obtained was 0.6535. Thus, their suggested optimal scaling range was [0.6535, 1.3070). From FIG. 2, this scaling range still includes the discontinuity at $a=0.9$ (n=1). A correct choice of $k_{opt}$ should be able to avoid such discontinuity.

As illustrated above, the basic encoding operations of arithmetic coding are the updates of the size and the beginning pointer of the current subinterval, which require two multiplications. Generally, multiplication is an expensive and usually slow operation in both hardware and software implementations. Some early work has been done to avoid multiplications with some performance penalty for binary-alphabet cases. Rissanen and Mohiuddin proposed a multiplication-free multialphabet arithmetic code. Although this multiplication-free scheme is very simple, the performance of this code degrades significantly when the probability of the most probable symbol is small (<0.5). This scheme has been modified to have a better approximation of the probability model with a shift and add operation. However, the coding performance may still degrade significantly.

U.S. Pat. No. 4,989,000 discloses a data storing compression method using arithmetic encoding with simplified probability sub-interval estimating. A scaling factor disclosed therein takes on a limited number of binary values. Also, the scaling factor is solely determined by the contents of a register. Consequently, the method can only use a fixed model for statistics of source symbols.

SUMMARY OF THE INVENTION

An object of the present invention is to provide method and system for efficient, relatively simple multiplication-free arithmetic coding which has minor performance degradation in all cases.

Another object of the present invention is to provide method and system for efficient, multiplication-free, multi-alphabetic arithmetic coding which has a degradation that provides a good trade-off between performance and complexity.

Still another object of the present invention is to provide method and system for efficient arithmetic coding wherein not only a fixed model for statistics of source symbols may be accommodated but also an adaptive model can be accommodated.

In carrying out the above objects and other objects of the present invention, a method is provided for compressing data in a data transmission system. The method includes the steps of inputting a first set of data representing an alphabet of source symbols including a current symbol and generating for each source symbol an arithmetic representation of a successive subinterval within a predetermined interval. The width of each subinterval is equal to the width of the previous subinterval weighted by the current symbol's frequency of occurrence. The method further includes the step of approximating the width of a new subinterval with a single shift and add operation as a function of both the width of the current subinterval and a total count of source symbols in a statistical source model. Finally, the method includes the step of outputting a second set of data based on the arithmetic representations. The second set of data is a compressed representation of the source symbols.

A system is also provided for carrying out each of the above method steps.

In further carrying out the above objects and other objects of the present invention, a method is provided for compressing and decompressing data in a data transmission system including an "A" shift register and a "C" shift register each having w binary digit positions. The compression method includes the steps of (a) initially setting the contents of the "C" register to all zeroes and the contents of the "A" register to a predetermined value and (b) inputting a first set of data representing an alphabet of source symbols including a current symbol. An individual frequency value $n_i(s)$ and an accumulated frequency value $r_i(s)$ are available for each of the source symbols. For each of the source symbols, the method further includes the steps of (c) determining a scaling factor $\beta$ as a function of the contents of the "A" register and a total count of source symbols in a statistical source model; and (d) adding the value $B^*r_i(s)$ to the contents of the "C" register. The method includes the step of (e) determining the contents of the "A" register if the current symbol is not the last symbol of the alphabet of source symbols, by inserting the value $B^*n_i(s)$ into the "A" register; or if the current symbol is the last symbol of the alphabet of source symbols, by subtracting the value $B^*r_i(s)$ from the contents of the "A" register. Additionally, the method includes the steps of (f) shifting both the "A" register and the "C" register in a predetermined direction until the contents of the "A" register lie within a predetermined range, filling the vacated positions in the "A" register with zeroes, and (g) if the current symbol is not the last symbol of the source symbols, repeating steps (c) through (f), or if the current symbol is the last symbol of the source symbols, shifting the contents of the "C" register by w positions in said predetermined direction. The sequence of binary digits shifted out of the "C" register is a compressed representation of the source symbols.

A decompression method is also provided for reversing the above-noted compression method.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Introduction

Before the method and system of the present invention is described herein, a correction of the Rissanen and Mohiuddin optimal scaling range is described as follows.

Optimal Scaling Range For A Fixed Model

A number in [1,2k) can also be rescaled to a number in [0.5,k). The width of the former range is twice of the latter's. Under the assumption of uniform distribution over [k,2k), the integral over [1,2k) is actually weighted twice as the integral over [k,2). This results in a peculiar phenomenon that a same segment of numbers is weighted differently for different ways of scaling. A more reasonable assumption is that a is uniformly distributed over [0.5,1) or equivalently [1,2) if a is normalized into these ranges.

In order to find the optimal k under this assumption, one can rewrite $\delta$ in (8) as follows, with consideration of $n=1$ and $p_m = n_m$.

$$\delta_f(p_m, a, \beta) = p_m \log_2 p_m + (1-p_m)\beta + \log_2 a - p_m \log_2(a - 2^{-\beta}(1-p_m)). \quad (9)$$

$\beta$ is a free parameter in (9). For the time being, let the scaling range of a be [0.5,1). For an example of $p_m = 0.3$, $\delta_f$ is plotted for $\beta = 0$ and $\beta = 1$. Supposing one can choose $\beta$ freely, one would like to choose $\beta = 1$ for $0.5 \leq a < 0.78664$ and $\beta = 0$ for $0.78664 \leq a < 1$ to achieve minimum degradation, where $a = 0.78664$ is the crossing point of the two curves. Knowing $\delta_f(p_m, a, 1) = \delta_f(p_m, a, 1) = \delta_f(p_m, 2a, 0)$, if one normalized a into [0.78664, 2×0.78664), the $\beta$ can always be 0 and the minimal degradation is still achieved, i.e., $k_{opt} = 0.78664$ for $p_m = 0.3$. Thus, the optimal k for different $p_m$ can be obtained by solving a in $\delta_f(p_m, a, 1) = \delta_f(p_m, a, 0)$. Table I shows the optimal k for some different values of $p_m$. Using these optimal k's, there is no discontinuity of $\delta_f$ and changes of $\beta$ are not necessary, namely, $\beta = 0$ always.

TABLE I

| Optimal Scaling Range | | | | |
|---|---|---|---|---|
| $p_m$ | 0.1 | 0.2 | 0.3 | 0.4 |
| $k_{opt}$ | 0.90088 | 0.82667 | 0.78664 | 0.76408 |
| $p_m$ | 0.5 | 0.6 | 0.7 | 0.8 | 0.9 |
| $k_{opt}$ | 0.75000 | 0.74048 | 0.73365 | 0.72852 | 0.72453 |

Modified Multiplication-Free Arithmetic Codes

Figure 1:
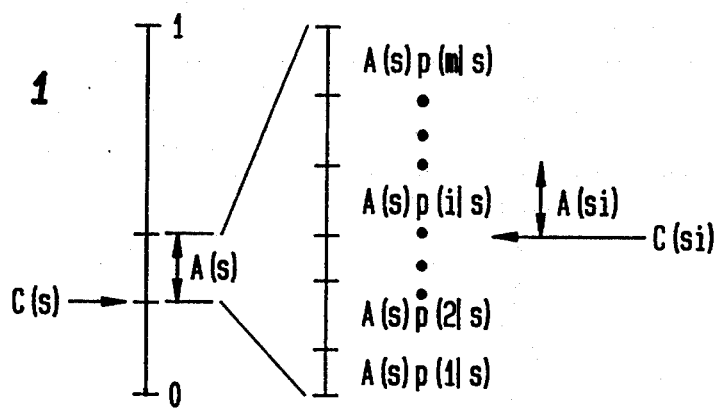
FIG. 1 is a graph illustrating a representation of an arithmetic code.
Figure 2:
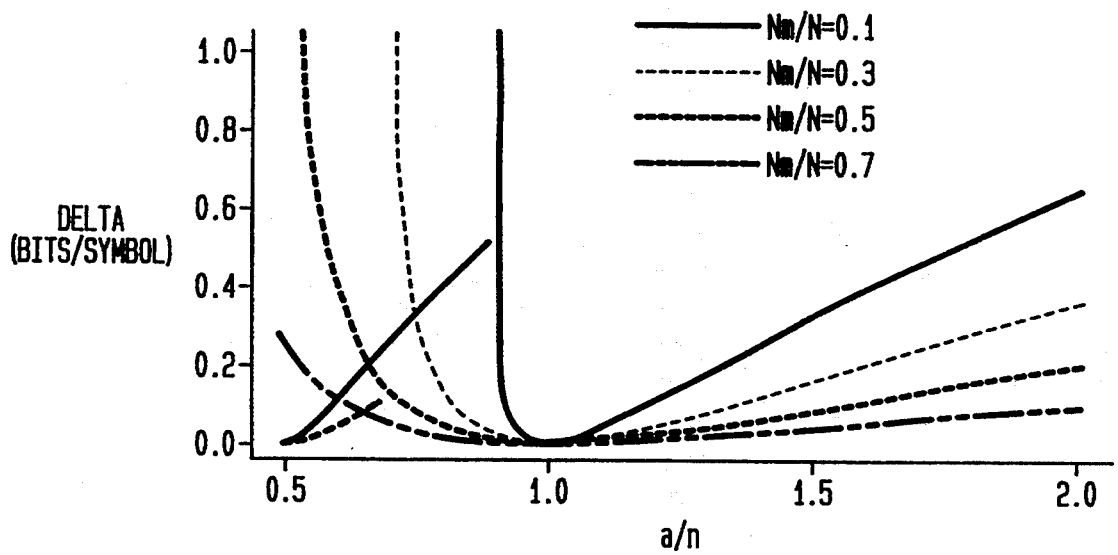
FIG. 2 are graphs illustrating degradations of Rissanen and Mohiuddin's scheme.
Figure 3:
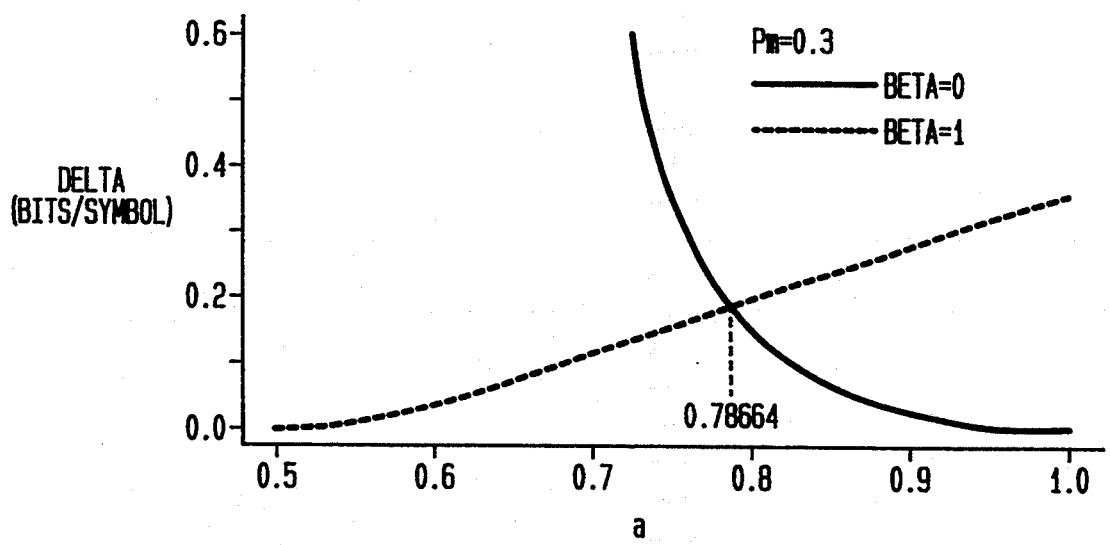
FIG. 3 are graphs illustrating the solution for optimal k.
Figure 4:
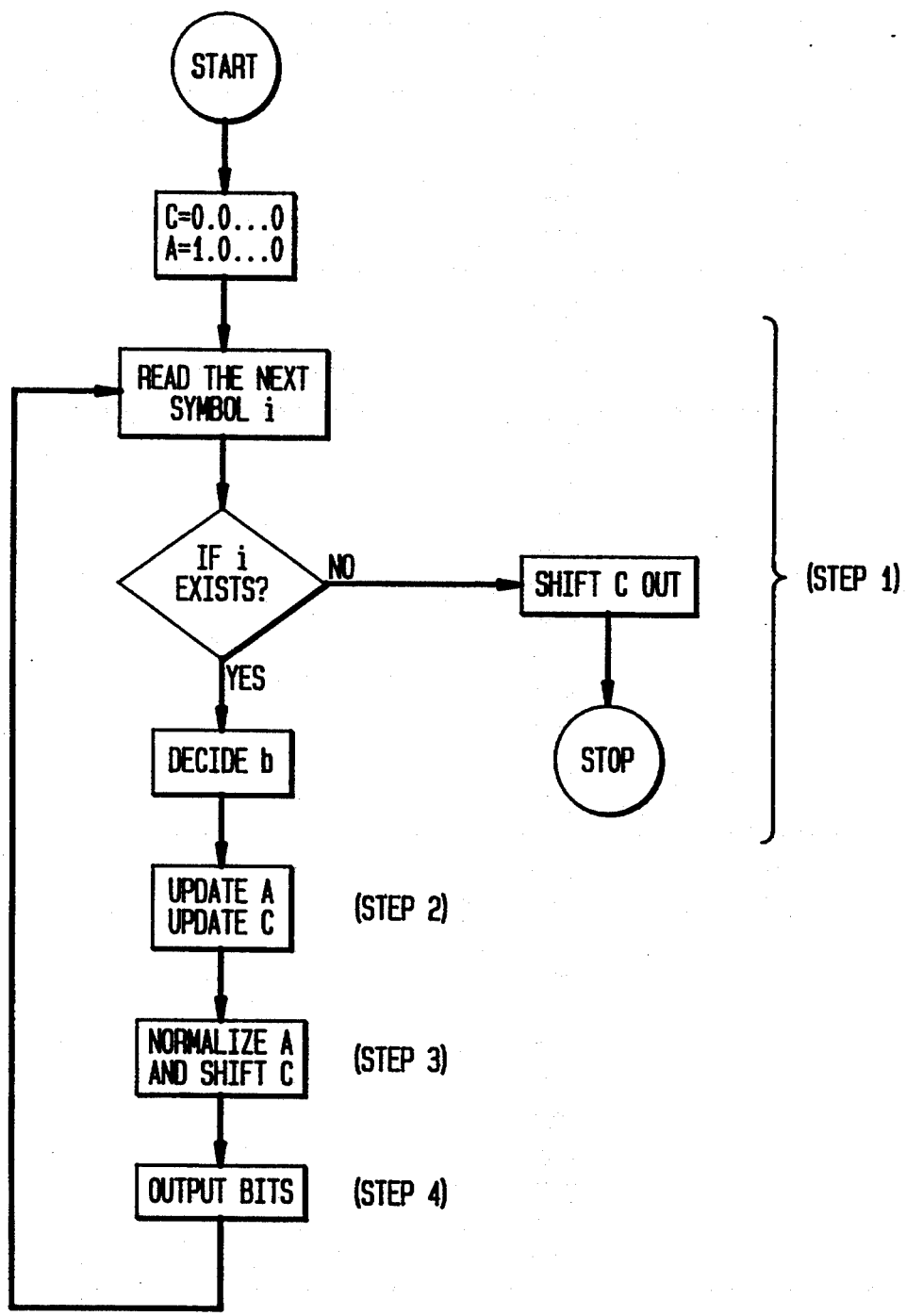
FIG. 4 is a block diagram flow chart illustrating an encoder algorithm of the present invention.
Figure 5:
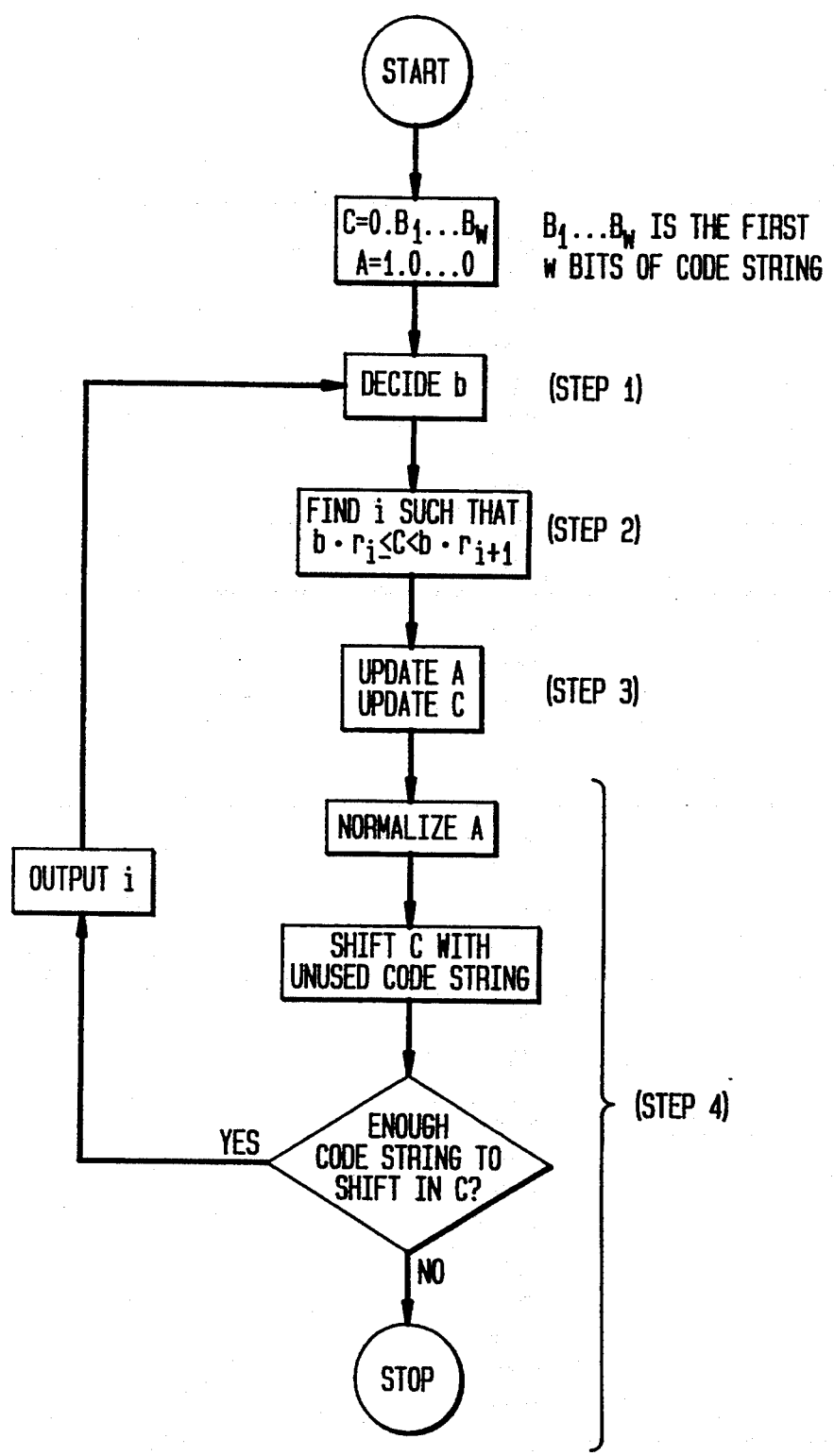
FIG. 5 is a block diagram flow chart illustrating a decoder algorithm of the present invention.
Figure 6A:
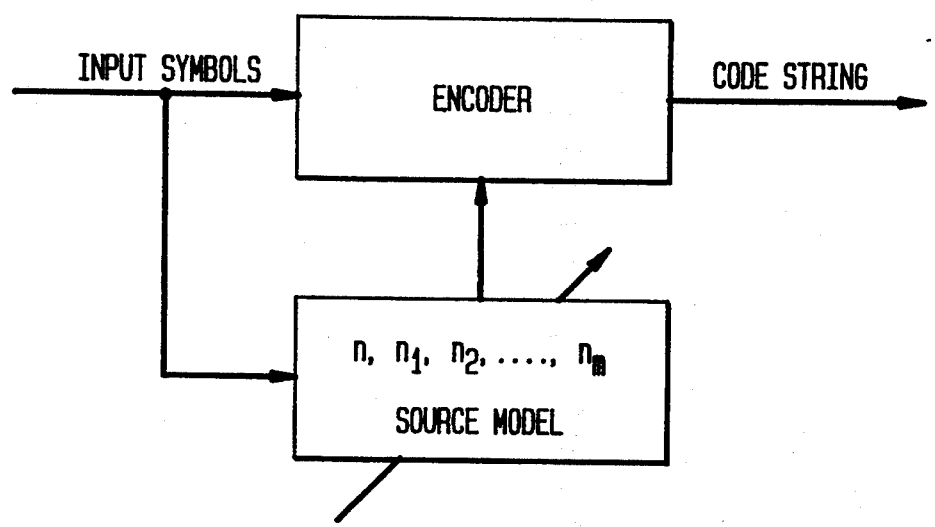
FIGS. 6a and 6b are schematic block diagrams illustrating an encoder and a decoder, respectively, of the present invention.
Figure 6B:
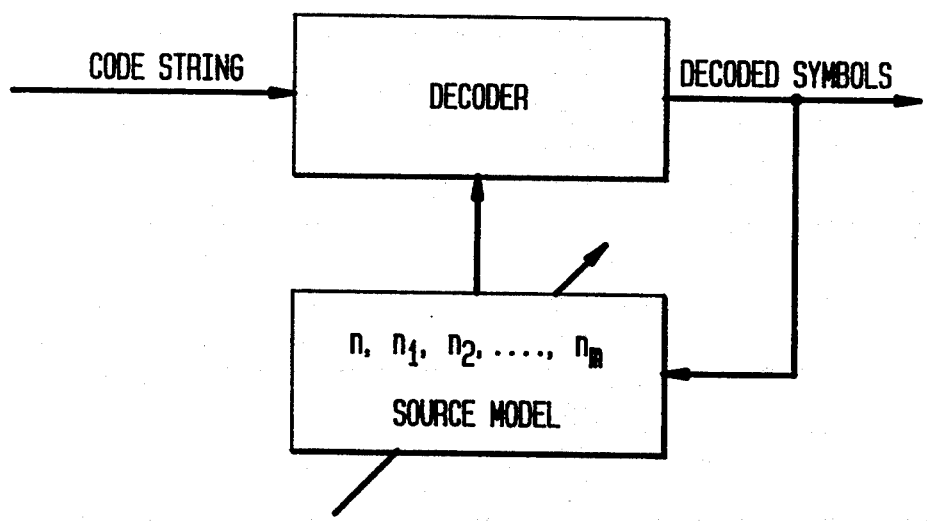

Referring again to the drawing figures, there is illustrated in FIG. 4 an encoder algorithm of the present invention. FIG. 5 illustrates a decoder algorithm of the present invention. FIGS. 6a and 6b are schematic block diagrams illustrating an encoder and a decoder, respectively, of the present invention as described in greater detail hereinbelow.

In general, the method and system of the present invention utilizes an approximation of a/n by a number b where $b = 2^i$ or $2^i \pm 2^j$, namely, $b \in B = \{0.5, 0.625, 0.75, 0.875, 1, 1.25, 1.5, 1.75, 2\}$. Thus, a multiplication by b can be implemented by a shift-and-add. The updates of a(s) and c(s) of the proposed schemes are:

$$a(si) = \begin{cases} [b \cdot n_i(s)]_N, & \text{if } i \neq m, \\ [a(s) - br_m(s)]_N, & \text{if } i = m, \end{cases} \quad (10)$$

$$c(si) = [c(s) + b \cdot r_i(s)]_N, \quad (11)$$

where b is determined by a(s)/n(s) and is discussed hereinbelow. In the real operations, the quantity generated by shift-and-add may need to be truncated by one to three bits. Such truncation creates a very minor performance degradation.

The approximated probability model of the proposed scheme is as follows:

$$p(i|s) \approx \begin{cases} b \cdot n_i(s)/a(s), & \text{if } i \neq m, \\ 1 - b \cdot (n(s) - n_m(s))/a(s), & \text{if } i = m, \end{cases} \quad (12)$$

Comparing (5) with (12), the degradation of the proposed scheme can be obtained easily by replacing $2^{-\beta}$ by b in (8).

$$\delta_{new}\left(\frac{n_m}{n}, \frac{a}{n}, b\right) = \frac{n_m}{n} \log_2 \frac{n_m}{n} - \left(1 - \frac{n_m}{n}\right)\log_2 b + \log_2 \frac{a}{n} - \frac{n_m}{n} \log_2\left[\frac{a}{n} - b\left(1 - \frac{n_m}{n}\right)\right]. \quad (13)$$

It can be observed later that the degradation $\delta_{new}$ becomes smaller as $n_m/n$ increases. Thus, one also places the most probable symbol at the last place, i.e., $n_m \geq n_i$, for all i.

The Optimal Choice Of b For A Fixed Model

Figure 7:
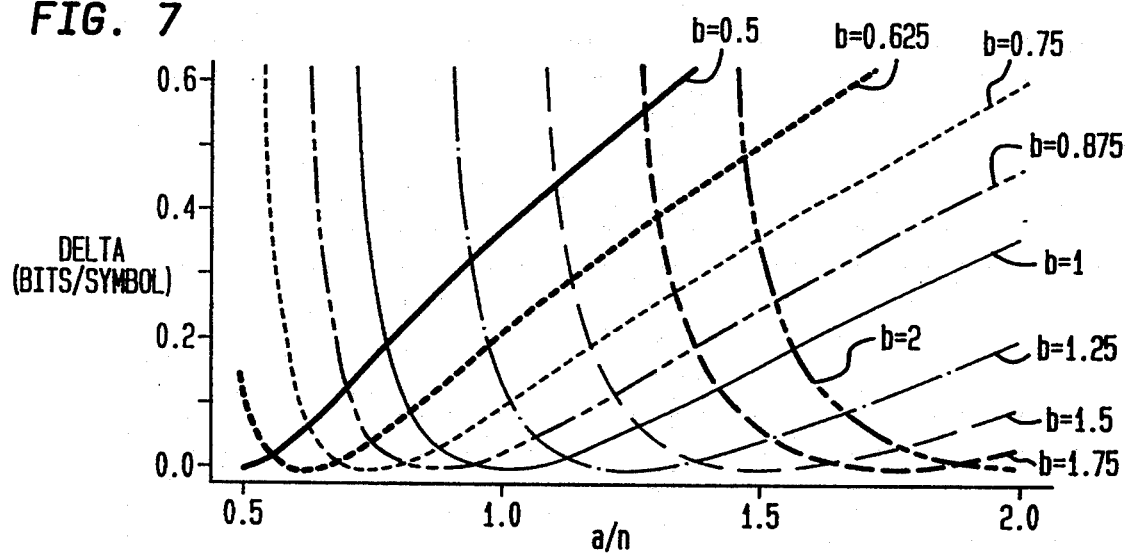
FIG. 7 are graphs illustrating degradations for different b.

FIG. 7 is a graph of $\delta_{new}(0.3, a/n, b)$ for different $b \in B$. $\delta_{new}=0$ for all curves if b=a/n (a perfect approximation), and the curve for each b is roughly just a translation of the other curves. It can be easily observed that the degradation can be kept small if b is chosen to follow the lower envelope of the curves. The optimal choice of b for this example (with $n_m/n=0.3$), is as follows:

$$b = \begin{cases} 0.5, & \text{if } 0.5 \leq a/n < 0.56558 \\ 0.625, & \text{if } 0.56558 \leq a/n < 0.69002 \\ 0.75, & \text{if } 0.69002 \leq a/n < 0.81463 \\ 0.875, & \text{if } 0.81463 \leq a/n < 0.93935 \\ 1, & \text{if } 0.93935 \leq a/n < 1.13117 \\ 1.25, & \text{if } 1.13117 \leq a/n < 1.38005 \\ 1.5, & \text{if } 1.38005 \leq a/n < 1.62927 \\ 1.75, & \text{if } 1.62927 \leq a/n < 1.87870 \\ 2, & \text{if } 1.87870 \leq a/n < 2 \end{cases} \quad (14)$$

Figure 8:
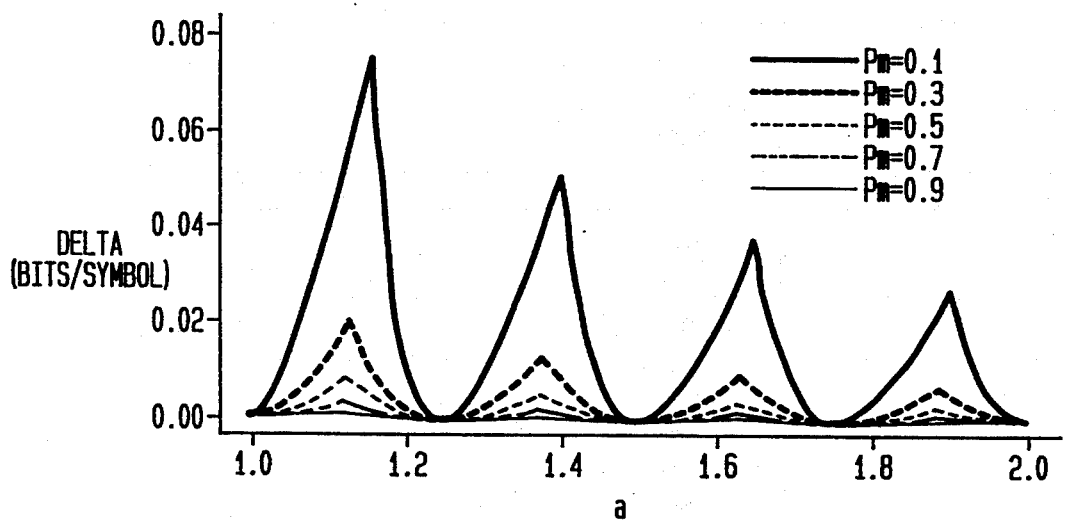
FIG. 8 are graphs illustrating degradation of the scheme of the present invention with optimal k.

The degradation is less than 0.025 bits for this example. However, since those division points are dependent on $n_m/n$, this optimal choice of b is only possible for the fixed-model cases. For a fixed-model case, one can set n=1 and normalize a into [1,2). Only four division points in [1,2) have to be pre-computed according to the given $n_m/n$ of the model. FIG. 8 shows the degradation versus a with respect to different $p_m$ (or $n_m/n$). It can be seen that the degradation becomes smaller as $p_m$ increases. The degradations for different a and $p_m$ are all quite minor (all less than 0.08 in FIG. 8).

The Choice Of b For An Adaptive Model

Since $p_m$ is variable in an adaptive model, the optimal division points cannot be determined. To accommodate all cases with different $p_m$, one uses a pessimistic approach. From FIG. 7, it can be observed that the degradation of each curve increases more steeply to the left of its minimal point than to the right. The infinite degradation point, at $a/n=b(1-p_m)$, approaches the minimal degradation point (a/n=b) as $p_m$ decreases. Therefore, a viable solution is to use only the right side of each curve. Namely, b, can be chosen as follows:

$$b = \begin{cases} 0.5, & \text{if } 0.5 \leq a/n < 0.625 \\ 0.625, & \text{if } 0.625 \leq a/n < 0.75 \\ 0.75, & \text{if } 0.75 \leq a/n < 0.875 \\ 0.875, & \text{if } 0.875 \leq a/n < 1 \\ 1, & \text{if } 1 \leq a/n < 1.25 \\ 1.25, & \text{if } 1.25 \leq a/n < 1.5 \\ 1.5, & \text{if } 1.5 \leq a/n < 1.75 \\ 1.75, & \text{if } 1.75 \leq a/n < 2 \end{cases} \quad (15)$$

Figure 9:
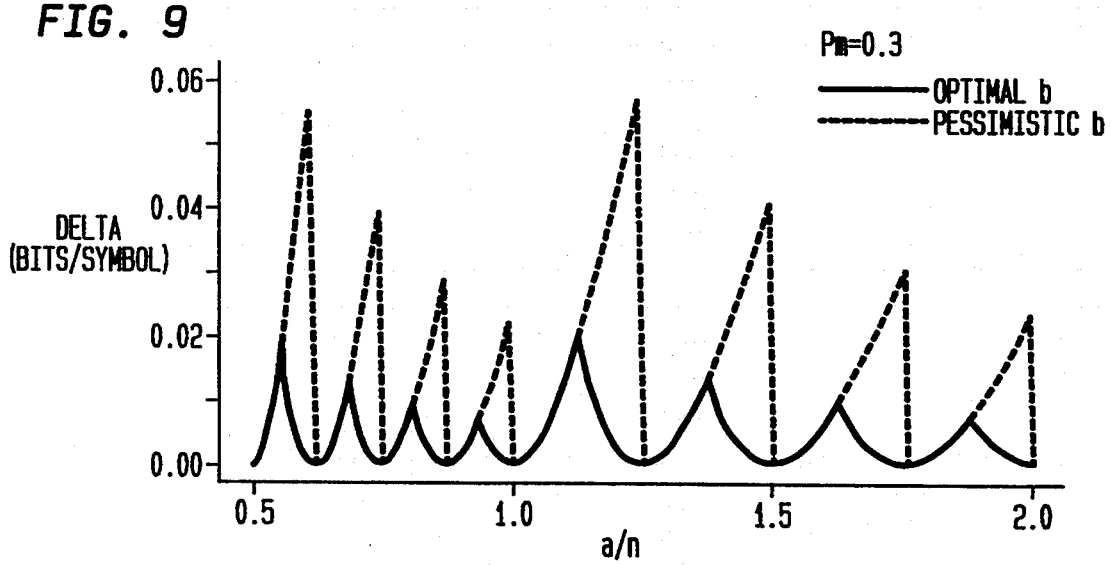
FIG. 9 are graphs illustrating degradation comparison for optimal b and pessimistic b.

Certainly, this choice of b will result in a larger degradation, compared to the optimal choice of b with known $p_m$. FIG. 9 shows the degradation comparison of these two choices of b for $p_m=0.3$. Although the degradation of pessimistic choice of b increases for some a, the peak degradation is still small, less than 0.06 bits/symbol. The peak degradations for different $p_m$ are always at a/(nb)=1.25 and are plotted on the solid line in FIG. 10. As expected, the peak degradation increases as $p_m$ decreases and reaches 0.3219 when $p_m$ approaches zero.

Choosing b according to (15) has a problem, namely, it would require a division of a by n, which is even more undesirable than a multiplication. In order to avoid this division, an approximation is made. One can just take the first four significant bits of a and n, and do a table look-up for b. Since the first significant bit is always 1, the table contains only $2^6=64$ entries, which are easy to implement by hardware or software.

Figure 10:
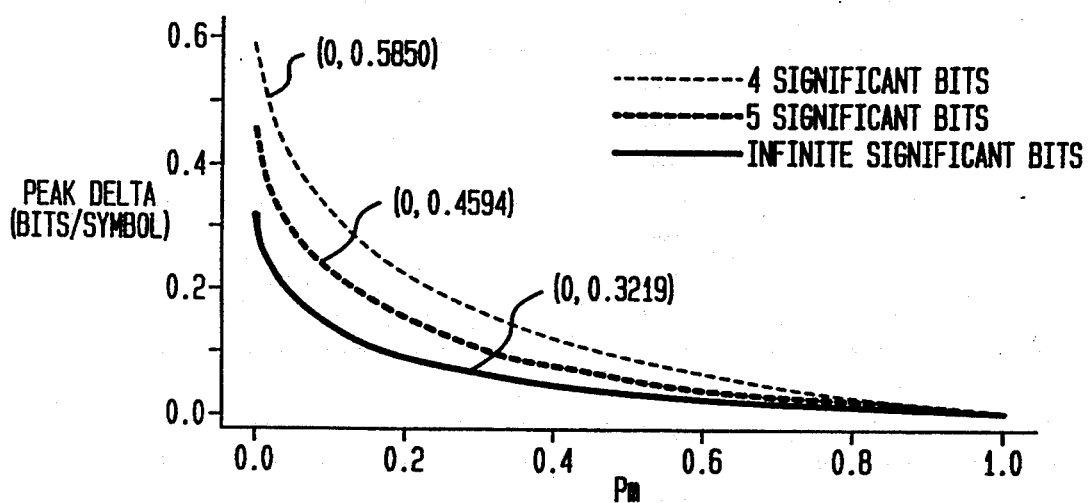
FIG. 10 are graphs illustrating peak degradations as a function of significant bits.

Let a' and n' denote the truncated values of a and n respectively. Assume a and n are all normalized into [1,2). The choice of b is still made according to (15) but with a pessimistic case, a/n=a'/(n'+0.125). Such pessimistic approach is taken to avoid any chance of infinite degradation. Such choice of b for 64 different a' and n' is tabulated in Table II. In this table, $R_{max}$ denotes the maximal degradation, for each pair of a' and n'. The maximal possible a/(nb) for all a' and n' is 1.5. The correspondent peak degradation versus $p_m$ is also shown in FIG. 10. If smaller degradation is desirable, five significant bits can be used and the look-up table size will become 256. The maximal possible a/(nb) for this case is 1.375. The correspondent peak degradation versus $p_m$ is also plotted in FIG. 10. FIG. 10 shows the maximal possible degradations. The average degradations are much less than these. Although this choice of b is designed to accommodate the adaptive models, it can certainly be used in the fixed models as well for the reasons of simplicity.

TABLE II

Pessimistic Scaling For An Adaptive Model

| a' | n' | b | $R_{max}$ | a' | n' | b | $R_{max}$ |
|---|---|---|---|---|---|---|---|
| 1.000 | 1.000 | 0.875 | 1.286 | 1.000 | 1.125 | 0.750 | 1.333 |
| 1.000 | 1.375 | 0.625 | 1.309 | 1.000 | 1.500 | 0.500 | 1.500 |
| 1.000 | 1.750 | 0.500 | 1.286 | 1.000 | 1.875 | 0.500 | 1.200 |
| 1.125 | 1.125 | 0.875 | 1.270 | 1.125 | 1.250 | 0.750 | 1.333 |
| 1.125 | 1.500 | 0.625 | 1.333 | 1.125 | 1.625 | 0.625 | 1.231 |
| 1.125 | 1.875 | 0.500 | 1.333 | 1.250 | 1.000 | 1.000 | 1.375 |
| 1.250 | 1.250 | 0.875 | 1.257 | 1.250 | 1.375 | 0.750 | 1.333 |
| 1.250 | 1.625 | 0.625 | 1.354 | 1.250 | 1.750 | 0.625 | 1.257 |
| 1.375 | 1.000 | 1.000 | 1.500 | 1.375 | 1.125 | 1.000 | 1.333 |
| 1.375 | 1.375 | 0.875 | 1.247 | 1.375 | 1.500 | 0.750 | 1.333 |
| 1.375 | 1.750 | 0.625 | 1.371 | 1.375 | 1.875 | 0.625 | 1.280 |
| 1.500 | 1.125 | 1.000 | 1.444 | 1.500 | 1.250 | 1.000 | 1.300 |
| 1.500 | 1.500 | 0.875 | 1.238 | 1.500 | 1.625 | 0.750 | 1.333 |
| 1.500 | 1.875 | 0.750 | 1.156 | 1.625 | 1.000 | 1.250 | 1.400 |
| 1.625 | 1.250 | 1.000 | 1.400 | 1.625 | 1.375 | 1.000 | 1.273 |
| 1.625 | 1.625 | 0.875 | 1.231 | 1.625 | 1.750 | 0.750 | 1.333 |
| 1.750 | 1.000 | 1.500 | 1.250 | 1.750 | 1.125 | 1.250 | 1.333 |
| 1.750 | 1.375 | 1.000 | 1.364 | 1.750 | 1.500 | 1.000 | 1.250 |
| 1.750 | 1.750 | 0.875 | 1.224 | 1.750 | 1.875 | 0.875 | 1.143 |
| 1.875 | 1.125 | 1.500 | 1.185 | 1.875 | 1.250 | 1.250 | 1.280 |
| 1.875 | 1.500 | 1.000 | 1.333 | 1.875 | 1.625 | 1.000 | 1.231 |
| 1.875 | 1.875 | 0.875 | 1.219 | | | | |

| a' | n' | b | $R_{max}$ |
|---|---|---|---|
| 1.000 | 1.250 | 0.625 | 1.440 |
| 1.000 | 1.625 | 0.500 | 1.385 |
| 1.125 | 1.000 | 1.000 | 1.250 |
| 1.125 | 1.375 | 0.750 | 1.212 |
| 1.125 | 1.750 | 0.500 | 1.429 |
| 1.250 | 1.125 | 1.000 | 1.222 |
| 1.250 | 1.500 | 0.750 | 1.222 |
| 1.250 | 1.875 | 0.625 | 1.173 |
| 1.375 | 1.250 | 1.000 | 1.200 |
| 1.375 | 1.625 | 0.750 | 1.231 |
| 1.500 | 1.000 | 1.250 | 1.300 |
| 1.500 | 1.375 | 1.000 | 1.182 |
| 1.500 | 1.750 | 0.750 | 1.238 |
| 1.625 | 1.125 | 1.250 | 1.244 |
| 1.625 | 1.500 | 1.000 | 1.167 |
| 1.625 | 1.875 | 0.750 | 1.244 |
| 1.750 | 1.250 | 1.250 | 1.200 |
| 1.750 | 1.625 | 1.000 | 1.154 |
| 1.875 | 1.000 | 1.500 | 1.333 |
| 1.875 | 1.375 | 1.250 | 1.164 |
| 1.875 | 1.750 | 1.000 | 1.143 | a' and n': first 4 significant bits of a and n.
$R_{max}$: the maximal possible a/(nb).

Coding Method And System

Let the length of registers A and C be w. The contents of Register A and C are interpreted as binary numbers with the binary point at the right of the first bit. Let the length of a guard register $C_g$ be $w_g$. The guard register $C_g$ is connected to the left end of the register C. The bits shifted out from the left end of register C are shifted into register $C_g$ and a carry-over from the left end of C is added to $C_g$. There is a counter to keep track of the number of bits in register $C_g$ which have not been outputted. Basically, one can output bits in $C_g$ which will not be changed by a carry-over from register C, namely, the bits left to the right most zero bit in $C_g$. A possible long propagation of the carry-over due to a long string of 1's existing in $C_g$ can be blocked by bit stuffing, i.e., zero insertion. The bit stuffing has to be done such that the decoder is able to identify the stuffing bits and undo them properly. One possible way is to insert a zero after every $w_g-1$ consecutive 1's. The overhead incurred is $$\frac{1}{w_g-1}$$

To simplify the description, the encoding algorithm described below does not include the detailed operations on register $C_g$ dealing with code output and bit stuffing, and the decoding algorithm does not include the process of undoing the stuffing bits.

Encoding Algorithm

Referring now to FIG. 4, initially set register C=0.0 ... 0 and A=1.0 ... 0.

1. Read the next symbol i. If none exists, output the remaining bits in $C_g$ and the whole contents of C, and then stop. Otherwise, determine b according to the current A and n.
2. Update A and C according to (10) and (11), respectively.
3. Normalize A into [1,2) and shift C accordingly.
4. Output the ready-to-output bits in $C_g$. Conduct bit stuffing if necessary.
5. Go to step 1.

This encoding algorithm can be illustrated by a simple example. In this example, n=1, $n_1$=0.011, $n_2$=0.001, and $n_3$=0.1, all in binary numbers. The example input string is "211323" and the register length used is w=6. The contents of A and C after step 3 of each iteration are listed in Table III. The value of b corresponding to the A on each line is determined according to (15) and is also listed in Table III.

TABLE III

An Encoding Example

| Symbol | Reg. C | Reg. A | b |
|---|---|---|---|
| start | 0.00000 | 1.00000 | 1. |
| 2 | 001 1.00000 | 1.00000 | 1. |
| 1 | 0 0110 0.00000 | 1.10000 | 1.1 |
| 1 | 00 1100 0.00000 | 1.00100 | 1. |
| 3 | 001 1000 1.00000 | 1.01000 | 1.01 |
| 2 | 00 1100 0101 1.11000 | 1.01000 | 1.01 |
| 3 | 001 1000 1100 0.11000 | 1.01000 | 1.01 |

Code String: 0011 0001 1000 1100 0

Decoding Algorithm

Referring now to FIG. 5, initialize C with the first w bits of the code string and set A=1.0 ... 0.

1. Determine b according to the current A and n.
2. Find the largest symbol i such that $b.r_i \leq C$, where $$r_i = \sum_{j=1}^{i-1} n_j.$$

This symbol i is a possible decoded symbol.

3. Update A according to (10) and Update C as follows:

$$C(new) = C(current) - b.r_i. \tag{16}$$

4. Shift A and C left the same number of bits such that A $\in$ [1,2) and fill the empty positions of C from unused code string. If the unused code string does not have enough bits to fill in, stop. Otherwise, output symbol i and go to step 1.

The same example is used to illustrate the decoding algorithm in Table IV. This table lists the contents of A and C after the step 4 of each iteration. The symbol i found in step 2 cannot be determined as a decoded symbol until step 4.

TABLE IV

| A Decoding Example | | | |
|---|---|---|---|
| Decoded Symbol | Reg. C | Reg. A | b |
| start | 0.01100 | 1.00000 | 1. |
| 2 | 0.00011 | 1.00000 | 1. |
| 1 | 0.01100 | 1.10000 | 1.1 |
| 1 | 0.11000 | 1.00100 | 1. |
| 3 | 0.10001 | 1.01000 | 1.01 |
| 2 | 0.10100 | 1.01000 | 1.01 |
| 3 | 0.00000 | 1.01000 | 1.01 |

Decoded Symbols: 211323

Performance Comparison

The performance of Rissanen-Mohiuddin's multiplication-free scheme and the method and system of the present invention are compared herein below by both theoretical analysis and computer simulation. In order to separate from the effect of model mismatch, the comparisons are made by fixed-model cases and the probability model used exactly matches the statistics of the test data. Without loss of any generality, n is normalized to 1. The choice of b in the method and system of the present invention is made according to (15).

Theoretical Analysis

Assuming a is uniformly distributed over [0.5, 1), one can derive an analytic expression for the average degradations for different $p_m$. The average degradation is just the integral of the corresponding degradation on a (from 0.5 to 1) divided by 0.5. It happens that the integral of $\delta_{new}(p_m,a,b)$ in (13) has a close-form expression:

$$\int \delta_{new}(p_m,a,b)da = ap_m\log_2 p_m - a(1 - p_m)\log_2 b + \quad (17)$$

$$a\log_2\frac{a}{e} - p_m(a - b + bp_m)\log_2\frac{(a - b + bp_m)}{e},$$

where e is the nature number. The average degradation for Rissanen-Mohiuddin's multiplication-free arithmetic code can be computed by:

$$\Delta_{RM}(p_m) = \frac{1}{0.5}\left[\int_{0.5}^{x}\delta_{new}(p_m,a,0.5)da + \int_{x}^{1}\delta_{new}(p_m,a,1)da\right], \quad (18)$$

where $x = \max(0.75, 1 - p_m)$. (19)

The part of the first integral from 0.5 to 0.75 computes the average degradation for a $\epsilon[1,1.5)$. When $1-p_m > 0.75$, the degradation for a $\epsilon[0.75, 1-p_m)$ is $\delta(p_m,a,\beta=1)$ in (9), which is equal to $\delta_{new}(p_m, a, b=0.5)$. Similarly, the degradation of a $\epsilon [x,1)$, where x is defined in (19), is $\delta(p_m,a,\beta=0)=\delta_{new}(p_m,a,b=1)$.

On the other hand, the average degradation for the multiplication-free arithmetic code of the present invention can be expressed as:

$$\Delta_L(p_m) = \frac{1}{0.5}\left[\int_{0.5}^{0.625}\delta_{new}(p_m,a,0.5)da + \right. \quad (20)$$

$$\int_{0.625}^{0.75}\delta_{new}(p_m,a,0.625)da + \int_{0.75}^{0.875}\delta_{new}(p_m,a,0.75)da +$$

$$\left.\int_{0.875}^{1}\delta_{new}(p_m,a,0.875)da\right]$$

Figure 11:
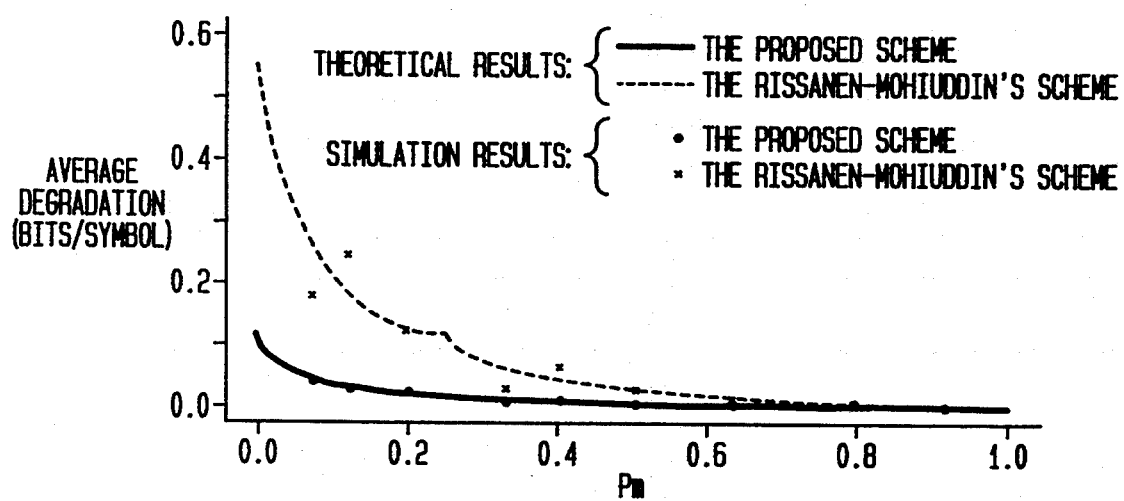
FIG. 11 are graphs illustrating average degradation comparisons.

These average degradations are plotted in FIG. 11, where $\Delta_L(p_m)$ is on the solid line and $\Delta_{RM}(p_m)$ is on the dash line. It can be observed that the scheme of the present invention always outperforms Rissanen-Mohiuddin's scheme by a significant margin. The average degradation of the scheme of the present invention is smaller than that of Rissanen-Mohiuddin's scheme by 3.96 to 6.73 times. The peculiar bend of Rissanen-Mohiuddin's curve at $p_m=0.25$ is due to the switch of integral range in (19).

FIG. 11 provides a view of the absolute degradations. Although the entropy of a test data is not fixed for a specific $p_m$, where $p_m$ is the probability of the most probable symbol, its minimal entropy can be expressed as:

$$H_{min}(p_m) = -hp_m\log_2 p_m - (1-hp_m)\log_2(1-hp_m), \quad (21)$$

where $h=[1/p_m]$, i.e. the largest integer which is smaller than or equal to $1/p_m$. The minimal entropy is formed when one has as few symbols as possible and the probability of each symbol is as large as possible, but less than or equal to $p_m$. When $p_m$ is small, $H_{min}(p_m) \approx \log_2 p_m$. The percentage of $\Delta_L(p_m)/H_{min}(p_m)$ versus $p_m$ is plotted in FIG. 12. This figure provides a theoretical upper bound of the relative degradation of the proposed coding scheme. From FIG. 12, one can see that the relative degradation of the coding scheme is less than 1.5%, which is tolerable for most practical applications.

Computer Simulation

Test data files were artificially generated according to ten different probability distributions.

These probability distributions were some of the observed statistics on the high-order conditional entropy coding tables used in subband image coding. The distributions were selected such that their most probable symbols had different probabilities, ranging from 0.07516 to 0.90887. Each test file contained 32768 data, and each data was generated independently according to a probability distribution.

Three different algorithms were tested: 1) the basic arithmetic code with multiplication, 2) Rissanen-Mohiuddin's multiplication-free arithmetic code, and 3) the multiplication-free arithmetic code of the present invention. The probability models used in the simulation exactly matched the symbol distribution of the test data. Thus, the simulation did not incur any degradation due to model mismatch.

TABLE V

| Simulation Results | | | |
|---|---|---|---|
| $p_m$ | $\|\mathcal{A}\|$ | Entropy | $\Delta_{ac}^s$ |
| 0.07516 | 40 | 4.623987 | 0.001410 |
| 0.12509 | 36 | 4.113107 | 0.001487 |
| 0.20325 | 33 | 3.319761 | 0.001437 |
| 0.33054 | 21 | 2.460201 | 0.001072 |
| 0.39935 | 24 | 2.666868 | 0.001223 |
| 0.50378 | 12 | 1.947573 | 0.001066 |
| 0.63089 | 20 | 1.615333 | 0.001214 |
| 0.70444 | 18 | 1.450019 | 0.001244 |
| 0.79501 | 11 | 1.064841 | 0.000924 |

TABLE V-continued

Simulation Results

| 0.90887 | 12 | 0.547559 | 0.001086 |
|---|---|---|---|
| $\Delta_{rm}{}^s$ | | $\Delta_1{}^s$ | $\Delta_{rm}{}^s/\Delta_1{}^s$ |
| 0.181006 | | 0.048010 | 3.77 |
| 0.249259 | | 0.034934 | 7.14 |
| 0.122896 | | 0.027041 | 4.54 |
| 0.031559 | | 0.013371 | 2.36 |
| 0.067507 | | 0.010988 | 6.14 |
| 0.029356 | | 0.005888 | 4.99 |
| 0.014397 | | 0.004784 | 3.01 |
| 0.010095 | | 0.004205 | 2.40 |
| 0.010202 | | 0.002725 | 3.74 |
| 0.004809 | | 0.001849 | 2.60 |

$|\mathcal{A}|$: The size of alphabet set.
$\Delta_{ac}{}^s$: The degradation of arithmetic code with multiplications.
$\Delta_{rm}{}^s$: The degradation of Rissanen-Mohiuddin's multiplication-free scheme.
$\Delta_1{}^s$: The degradation of the multiplication-free scheme of the present invention.
(Entropy and degradations are all in bits/symbol).

The simulation results are shown in Table V. The degradations of the algorithms were calculated by subtracting the entropy from their coding rates. The results for the basic arithmetic code with multiplications are shown as references for the degradations due to the finite word-length w of the registers A and C. The word length w was 16 in the implementations. From the fourth column of the table, one can see that these degradations due to the finite word-length were all very minor (less than 0.2% of their entropy) and could be neglected for most practical cases.

The fifth and sixth columns of the table show the degradations for Rissanen-Mohiuddin's coding scheme and the coding scheme of the present invention, respectively. The degradations of Rissanen-Mohiuddin's coding scheme ranged from 0.696% to 6.06% of the entropy, while the maximal degradation of the coding scheme of the present invention was only 1.04%. Generally speaking, the degradations of cases with smaller $p_m$ are worse than those cases with larger $p_m$. Comparing the fifth to the sixth column of the table, one can see that the scheme of the present invention consistently outperformed Rissanen-Mohiuddin's scheme by 2.36 to 7.14 times, which were listed in the last column.

These simulation results are plotted in FIG. 11. It can be observed that the simulation results of the proposed scheme are very close to the results predicted by the theoretical analysis. However, for Rissanen-Mohiuddin's scheme, there are obvious discrepancies between the simulation results and the theoretical predictions, especially when $p_m$ is small. This is because the real distribution of a is highly non-uniform, which is contrary to the assumption made in the theoretical analysis. If one looks at (3) more carefully, the update of a in the Rissanen-Mohiuddin's scheme can be almost independent on the previous a and the values of a tend to concentrate on a few values, e.g. $2^{-\beta}n_i(s)$. This is especially true when $p_m$ is small and the update of a is more probable to be done by simply replacing a by $2^{-\beta}n_i(s)$. In this case, if the normalized values of $2^{-\beta}n_i(s)$ are all very close to $1-p_m$, the degradation will be very severe.

For example, a test data contains 9 symbols, one with 3577 counts, another with 4096 counts, and the rest 7 symbols all with 3585 counts. The probability of its most probable symbol is 0.125. If coded by Rissanen-Mohiuddin's scheme, with 0.7658 ($=3585\times7/32768$) probability, the a will be updated as 3585/32768. It will be further normalized to $8\times3585/32768$ ($\approx0.875244$), which is very close to $1=p_m$. The degradation for $p_m=0.125$, $a=0.875244$, and $\beta=0$ can be computed by (9) and is equal to 0.93276 bits/symbol.

Thus, the total degradation of Rissanen-Mohiuddin's scheme for this test data is at least 0.71434 ($=0.7658\times0.93276$) bits/symbol. The simulation result for this test data by Rissanen-Mohiuddin's coding scheme shows 0.77681 bits/symbol of degradation, which is 4.3 times of $\Delta_{RM}(0.125)$ and is 24.51% of entropy. The performance of Rissanen-Mohiuddin's coding scheme can also be better than those predicted by $\Delta_{RM}(p_m)$ in (18) if the $2^{-\beta}n_i(s)$ for most symbols occur to be "right" values. However, it can be concluded that the coding scheme of the present invention provides much better and reliable performance for all cases.

Figure 12:
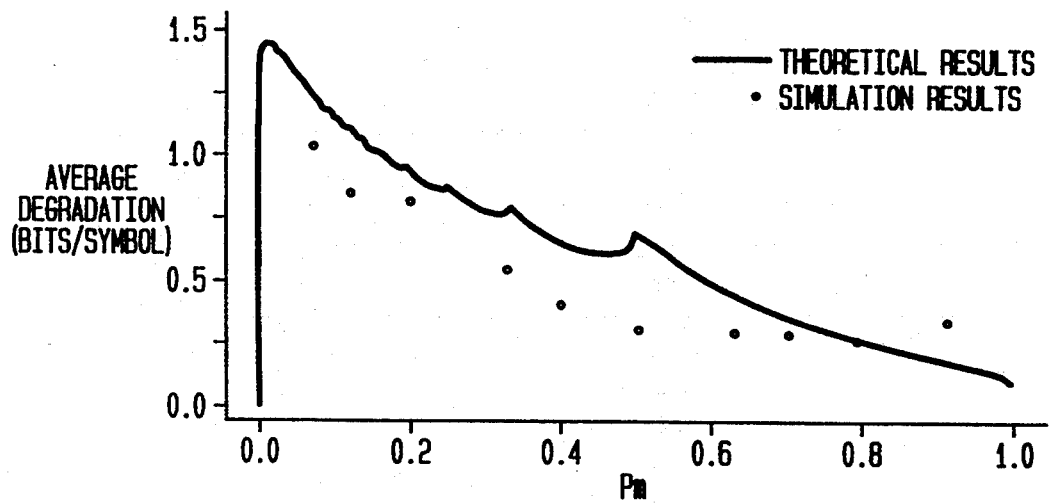
FIG. 12 are graphs illustrating relative degradation for the method and system of the present invention.

The relative degradations (i.e. degradation/entropy) of the coding scheme of the present invention are plotted in FIG. 12. As expected, most points were below the theoretical upper bound except the last point with $p_m=0.90887$. The excursion of this point can be explained by the relatively significant degradation caused by the finite word-length registers, which can be verified by a comparison of column four and six in Table V.

The method and system of the present invention provides a new multiplication-free arithmetic code which replaces each multiplication with a single shift-and-add. The performance of the coding scheme of the present invention is consistently several times better than that of Rissanen-Mohiuddin's coding scheme by both theoretical analysis and simulation results. The degradation of the coding scheme of the present invention has been proven theoretically to be less than 1.5% of the entropy. While the multiplication-free coding scheme of the present invention has higher complexity, it provides an excellent compromise between good performance and low complexity.

While the best mode for carrying out the invention has been described in detail, those familiar with the art to which this invention relates will recognize various alternative designs and embodiments for practicing the invention as defined by the following claims.

What is claimed is:

1. In a data transmission system, a data compression system comprising:

means for inputting a first set of data representing an alphabet of source symbols including a current symbol;

means for generating for each source symbol an arithmetic representation of a successive subinterval within a predetermined interval, the width of each subinterval being equal to the width of the previous subinterval weighted by the current symbol's frequency of occurrence;

means for approximating the width of a new subinterval with a single shift and add operation as a function of both the width of the current subinterval and a total count of source symbols in a statistical source model; and means for outputting a second set of data based on the arithmetic representations, whereby the second set of data is a compressed representation of the alphabet of source symbols.

2. A method for compressing data in a data transmission system including an "A" shift register and a "C" shift register each having w binary digit positions, the method comprising the steps of:

(a) initially setting the contents of the "C" register to all zeroes and the contents of the "A" register to a predetermined value;

(b) inputting a first set of data representing an alphabet of source symbols including a current symbol, an individual frequency value $n_i(s)$ and an accumulated frequency value $r_i(s)$ being available for each of the source symbols; and for each of the source symbols:

(c) determining a scaling factor B as a function of the contents of the "A" register and a total count of source symbols in a statistical source model;

(d) adding the value $B*r_i(s)$ to the contents of the "C" register;

(e) determining the contents of the "A" register if the current symbol is not the last symbol of the alphabet of source symbols, by inserting the value $B*n_i(s)$ into the "A" register; or if the current symbol is the last symbol of the alphabet of source symbols, by subtracting the value $B*r_i(s)$ from the contents of the "A" register;

(f) shifting both the "A" register and the "C" register in a predetermined direction until the contents of the "A" register lie within a predetermined range, filling the vacated positions in the "A" register with zeroes; and (g) if the current symbol is not the last symbol of the source symbols, repeating steps (c) through (f), or if the current symbol is the last symbol of the source symbols, shifting the contents of the "C" register by w positions in said predetermined direction; whereby the sequence of binary digits shifted out of the "C" register is a compressed representation of the source symbols.

3. The method as claimed in claim 2 wherein the predetermined value is 1.00000.

4. The method as claimed in claim 2 wherein the predetermined direction is such as to increase the magnitude of the contents of the "A" register.

5. The method as claimed in claim 2 wherein the predetermined range has a lower bound of 1.0 and an upper bound of <2.

6. A method for decompressing data which is a compressed representation of a number of source symbols in a data transmission system including an "A" shift register and a "C" shift register each having w binary digit positions, the method comprising the steps of:

(a) inputting a first set of data which is a compressed representation of an alphabet of source symbols including a current symbol, an individual frequency value $n_i(s)$ and an accumulated frequency value $r_i(s)$ being available for each of the source symbols;

(b) initially setting the contents of the "C" register to the w most significant digits of the compressed representation and the contents of the "A" register to a predetermined value;

decoding each of the source symbols by:

(c) determining a scaling factor B as a function of the contents of the "A" register and the number of source symbols;

(d) determining the largest value of the symbol i such that $B*r_i \leq C$, where $$r_i = \sum_{j=1}^{i-1} n_j,$$

wherein i is the symbol output of the decoder at the current step;

(e) determining the contents of the "A" register if the current symbol is not the last symbol of the alphabet of source symbols, by inserting the value $B*n_i(s)$ into the "A" register; or if the current symbol is the last symbol of the alphabet of source symbols, by subtracting the value $B*r_i(s)$ from the contents of the "A" register;

(f) subtracting the value $B*r_i(s)$ from the contents of the "C" register;

(g) shifting both the "A" register and the "C" register in a predetermined direction until the contents of the "A" register lie within a predetermined range, filling the vacated positions in the "A" register with zeroes, and filling the vacated positions in the "C" register with the corresponding number of most significant digits remaining of the compressed representation; and repeating steps (c) through (g) until no digits of the compressed representation remain.

7. The method as claimed in claim 6 wherein the predetermined value is 1.00000.

8. The method as claimed in claim 6 wherein the predetermined direction is such as to increase the magnitude of the contents of the "A" register.

9. The method as claimed in claim 6 wherein the predetermined range has a lower bound of 1.0 and an upper bound of <2.

* * * * *